(12) United States Patent
McCabe et al.

(10) Patent No.: US 9,395,767 B2
(45) Date of Patent: Jul. 19, 2016

(54) SIDE LOADING ENCLOSURE FOR A RACK MOUNT TYPE STORAGE UNIT

(71) Applicant: SANMINA CORPORATION, San Jose, CA (US)

(72) Inventors: Eugene McCabe, Fremont, CA (US); Timothy Lieber, Colorado Springs, CO (US); Paul Amdahl, Monument, CO (US)

(73) Assignee: SANMINA CORPORATION, San Jose, CA (US)

( * ) Notice: Subject to any disclaimer, the term of this patent is extended or adjusted under 35 U.S.C. 154(b) by 60 days.

(21) Appl. No.: 14/011,081

(22) Filed: Aug. 27, 2013

(65) Prior Publication Data
US 2014/0055944 A1    Feb. 27, 2014

Related U.S. Application Data

(60) Provisional application No. 61/693,646, filed on Aug. 27, 2012.

(51) Int. Cl.
| | |
|---|---|
| *G06F 1/16* | (2006.01) |
| *H05K 5/00* | (2006.01) |
| *H05K 7/00* | (2006.01) |
| *G06F 1/18* | (2006.01) |
| *G11B 33/12* | (2006.01) |
| *H05K 7/14* | (2006.01) |

(52) U.S. Cl.
CPC .............. *G06F 1/187* (2013.01); *G11B 33/125* (2013.01); *G11B 33/128* (2013.01); *H05K 7/1487* (2013.01)

(58) Field of Classification Search
CPC ........ G06F 1/187; H05K 7/1487; H05K 7/18; G11B 33/128; G11B 33/125

USPC ............ 361/679.33, 679.39, 39, 679.57, 361/679.58, 679.6
See application file for complete search history.

(56) References Cited

U.S. PATENT DOCUMENTS

| | | |
|---|---|---|
| 5,381,315 A | 1/1995 | Hamaguchi et al. |
| 5,751,549 A | 5/1998 | Eberhardt et al. |
| 6,392,884 B1 * | 5/2002 | Chou .................. 361/679.33 |

(Continued)

FOREIGN PATENT DOCUMENTS

| | | |
|---|---|---|
| CN | 102222521 A | 10/2011 |
| WO | 2009/108205 A1 | 9/2009 |

OTHER PUBLICATIONS

Extended European Search Report for 13832054.4 dated Dec. 14, 2015; 10 pages.

*Primary Examiner* — Bernard Rojas
(74) *Attorney, Agent, or Firm* — Julio Loza; Loza & Loza, LLP

(57) ABSTRACT

A side loading enclosure for a rack mount type storage unit is provided. The enclosure provides for easier access to hard disk drives (HDDs) for maintenance and repair as well as the ability to increase the number of HDDs that can be mounted in a single enclosure. The enclosure may include a bottom plate, a pair of side plates, and a pair of end plates. Located within the enclosure are a first row, extending perpendicularly between the pair of end plates, having one or more stacks of HDDs mounted to a first printed circuit board and a second row, extending perpendicularly between the pair of end plates, having one or more stacks of HDDs mounted to a second printed circuit board. The one or more stacks of HDDS in the first row is separate from and located parallel to the one or more stacks of HDDs in the second row.

20 Claims, 7 Drawing Sheets

(56) References Cited

U.S. PATENT DOCUMENTS

| | | |
|---|---|---|
| 6,621,693 B1 | 9/2003 | Potter et al. |
| 7,394,660 B2 | 7/2008 | Hidaka |
| 8,867,214 B2 * | 10/2014 | Ross et al. .................... 361/727 |
| 2005/0254210 A1 * | 11/2005 | Grady et al. .................. 361/695 |
| 2005/0257232 A1 * | 11/2005 | Hidaka ........................ 720/654 |
| 2006/0268444 A1 | 11/2006 | DeCenzo et al. |
| 2007/0230111 A1 * | 10/2007 | Starr et al. .................... 361/685 |
| 2007/0247804 A1 * | 10/2007 | Li et al. ......................... 361/687 |
| 2009/0013215 A1 | 1/2009 | Kakihara et al. |
| 2009/0231800 A1 | 9/2009 | Franz et al. |
| 2009/0257185 A1 * | 10/2009 | Signer et al. ............. 361/679.32 |
| 2011/0222234 A1 | 9/2011 | Davis et al. |

* cited by examiner

SIDE LOADING ENCLOSURE FOR A RACK MOUNT TYPE STORAGE UNIT

CLAIM OF PRIORITY

The present Application for Patent claims priority to U.S. Provisional Application No. 61/693,646 entitled "Enclosure Architecture of High Density, Easy Access, Racked Data Storage", filed Aug. 27, 2012, which is hereby expressly incorporated by reference.

FIELD

Various features relate to improvements to enclosures mounted in a rack mount type storage unit.

BACKGROUND

Enclosures for rack mount type storage units are well known. Typical enclosures used in rack mount type storages units arrange a plurality (3 to 14) hard disk drives (HDDs) in removable carriers that are accessible from the "front" of the enclosure (the side typically facing a user area), and usually are arranged so that data and power cables are accessible from the "back" of the enclosure. Although these enclosures allow HDDs to be replaced fairly easily if one were to fail, the number of HDDs that can be mounted in the enclosure is limited to how many HDDs will fit across the front area. As this front area is limited, the number of enclosures that are needed is greatly increased when large amount of data needs to be stored on HDDs.

Therefore, it may be desirable to provide an enclosure having an architecture that maximizes space by increasing the number of HDDs that can be mounted in the enclosure while still allowing for easy replacement of individual drives.

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to one feature, an enclosure for a rack mount storage unit is provided. The enclosure includes a bottom plate; a pair of side plates; a pair of end plates, the bottom plate, the pair of side plates and the pair of end plates being integrally connected; a first row, extending perpendicularly between the pair of end plates, having one or more stacks of hard disk drives connected to a first connecting member, each hard disk drive in the one or more stacks of hard disk drives in the first row co-planar with the bottom plate; and a second row, extending perpendicularly between the pair of end plates, having one or more stacks of hard disk drives connected to a second connecting member, each hard disk drive in the one or more stacks of hard disk drives in the second row co-planar with the bottom plate. The one or more stacks of hard disk drives in the first row may be separate from and located parallel to the one or more stacks of hard disk drives in the second row.

According to one example, each of the one or more stacks of hard disk drives includes five (5) 2.5 hard disk drives.

According to one example, each of the one or more stacks of hard disk drives includes three (3) 3.5 hard disk drives.

According to one example, the first connecting member may be an edge connector on a first cable located within the enclosure and the second connecting member may be an edge connector on a second cable located within the enclosure.

According to one example, the first connecting member may be one or more sockets located on a first surface, or a second opposing surface, of a first printed circuit board extending perpendicular to the bottom plate. The second connecting member may be one or more sockets located on a first surface, or a second opposing surface, of a second printed circuit board extending perpendicular to the bottom plate.

The enclosure may also include a power supply, mounted to the bottom plate between the one or more stacks of hard disk drives in the first row and the one or more stacks of hard disk drives in the second row, one or more input/output devices mounted on the bottom plate and accessible through an end plate in the pair of end plates, and a plurality of cooling fans mounted on the bottom plate.

The enclosure may also include a top plate integrally connected to the pair of end plates and the pair of side plates.

According to another feature, a vertical mount rack storage unit for holding enclosures is provided. The vertical mount rack storage unit may include a rectilinear frame having an upper portion and a lower portion integrally connected by a pair of front side portions and a pair of back end portions; a plurality of upper elongated rail members attached to an inner surface of the upper portion, the plurality of upper elongated rail members extending from a front end of the upper portion to a back end of the upper portion; a plurality of lower elongated rail members attached to an inner surface of the lower portion, the plurality of lower elongated rail members, extending from a front end of the lower portion to a back end of the lower portion, co-planar with the plurality of upper elongated rail members; and a plurality of enclosures slideably engaged with the plurality of upper elongated rail members and the plurality of lower elongated rail members, each enclosure in the plurality of enclosures vertically mounted in the rack storage unit; wherein one or more rows of hard disk drives are mounted within each of the plurality of enclosures such that the hard disk drives are co-planar with the lower portion of the frame allowing easy access to the disk drives when one of the plurality of enclosures is slideably pulled from the storage unit in a horizontal direction.

Each enclosure in the plurality of enclosures may comprises a bottom plate; a pair of side plates; a pair of end plates, the bottom plate, the pair of side plates and the pair of end plates being integrally connected; a first row, extending perpendicularly between the pair of end plates, having one or more stacks of hard disk drives connected to a first connecting member, each hard disk drive in the one or more stacks of hard disk drives in the first row co-planar with the bottom plate; and a second row, extending perpendicularly between the pair of end plates, having one or more stacks of hard disk drives connected to a second connecting member, each hard disk drive in the one or more stacks of hard disk drives in the second row co-planar with the bottom plate. The one or more stacks of hard disk drives in the first row may be separate from and located parallel to the one or more stacks of hard disk drives in the second row.

According to one example, each of the one or more stacks of hard disk drives includes five (5) 2.5 hard disk drives.

According to one example, each of the one or more stacks of hard disk drives includes three (3) 3.5 hard disk drives.

The vertical mount rack storage unit wherein the first connecting member may be one or more sockets located on a first surface, or a second opposing surface, of a first printed circuit board extending perpendicular to the bottom plate. The second connecting member may be one or more sockets located on a first surface, or a second opposing surface, a second printed circuit board extending perpendicular to the bottom plate.

The enclosure may also include a power supply, mounted to the bottom plate between the one or more stacks of hard disk drives in the first row and the one or more stacks of hard disk drives in the second row, one or more input/output devices mounted on the bottom plate and accessible through an end plate in the pair of end plates, and a plurality of cooling fans mounted on the bottom plate.

The enclosure may also include a top plate integrally connected to the pair of end plates and the pair of side plates.

According to one example, each enclosure in the plurality of enclosures is a 4U-60 drive.

DETAILED DESCRIPTION OF THE INVENTION

In the following detailed description of the invention, numerous specific details are set forth in order to provide a thorough understanding of the invention. However, the invention may be practiced without these specific details. In other instances, well known methods, procedures, and/or components have not been described in detail so as not to unnecessarily obscure aspects of the invention.

In the following description, certain terminology is used to describe certain features of one or more embodiments. The term "rack" may refer to any type of frame-like structure adapted to hold and display equipment. The term "data storage drive" may refer to a hard disk drive, a solid state drive or any type of drive for storing data.

Typically, hard disk drives (HDDs), hereinafter referred to as "drives", are mounted from the top or front of enclosures which are then mounted or inserted into a rack mount type storage unit. When drives are top mounted, accessing the drives for repair or replacement is difficult as it is a hassle to get in the top of the enclosure to remove the drives. Furthermore, the number of drives is limited to how many drives can fit across the front area of the enclosure. Typically with conventional mounting, the enclosure can hold twenty-two (22) or twenty-four (24) 2.5 inch drives or twelve (12) 3.5 inch drives.

Figure 8:
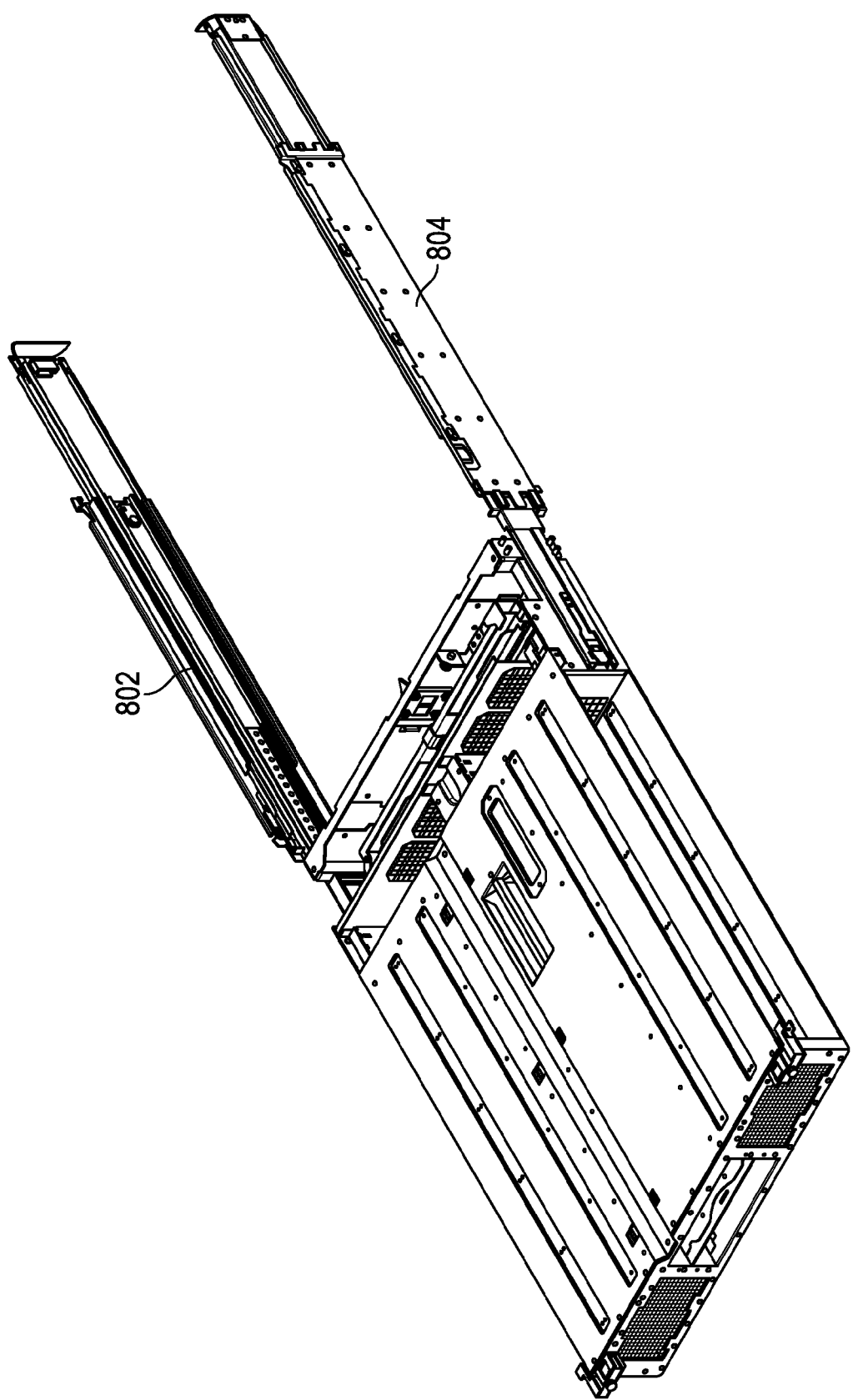
FIG. 8 illustrates a perspective view of a side loading enclosure mounted to slide rails for sliding the enclosure out of a rack mount type storage.

According to one aspect, a side loading enclosure for a rack mount type storage unit is provided. The side loading enclosure provides for easier access to HDDs for maintenance and repair as well as the ability to increase the number of HDDs that can be mounted in a single enclosure. Slide rails may be utilized to slide the enclosure out of the rack mount type storage unit the distance needed to access all of the HDDs in the enclosure. FIG. 8 illustrates a perspective view of a side loading enclosure mounted to slide rails 802, 804 for sliding the enclosure out of a rack mount type storage unit.

According to another aspect, a rack mount type storage unit for vertically mounting or receiving three (3) enclosures, such as 4U-60 drives, in 10U of rack space is provided. The rack mount type storage unit may provide for greater density compared to conventional units. The rack mount type storage unit may include a generally rectilinear frame for receiving the 4U-60 drives. To access one of the 4U-60 drives, the 4U-60 drive may be slideably pulled from the storage unit in a horizontal direction.

Figure 1:
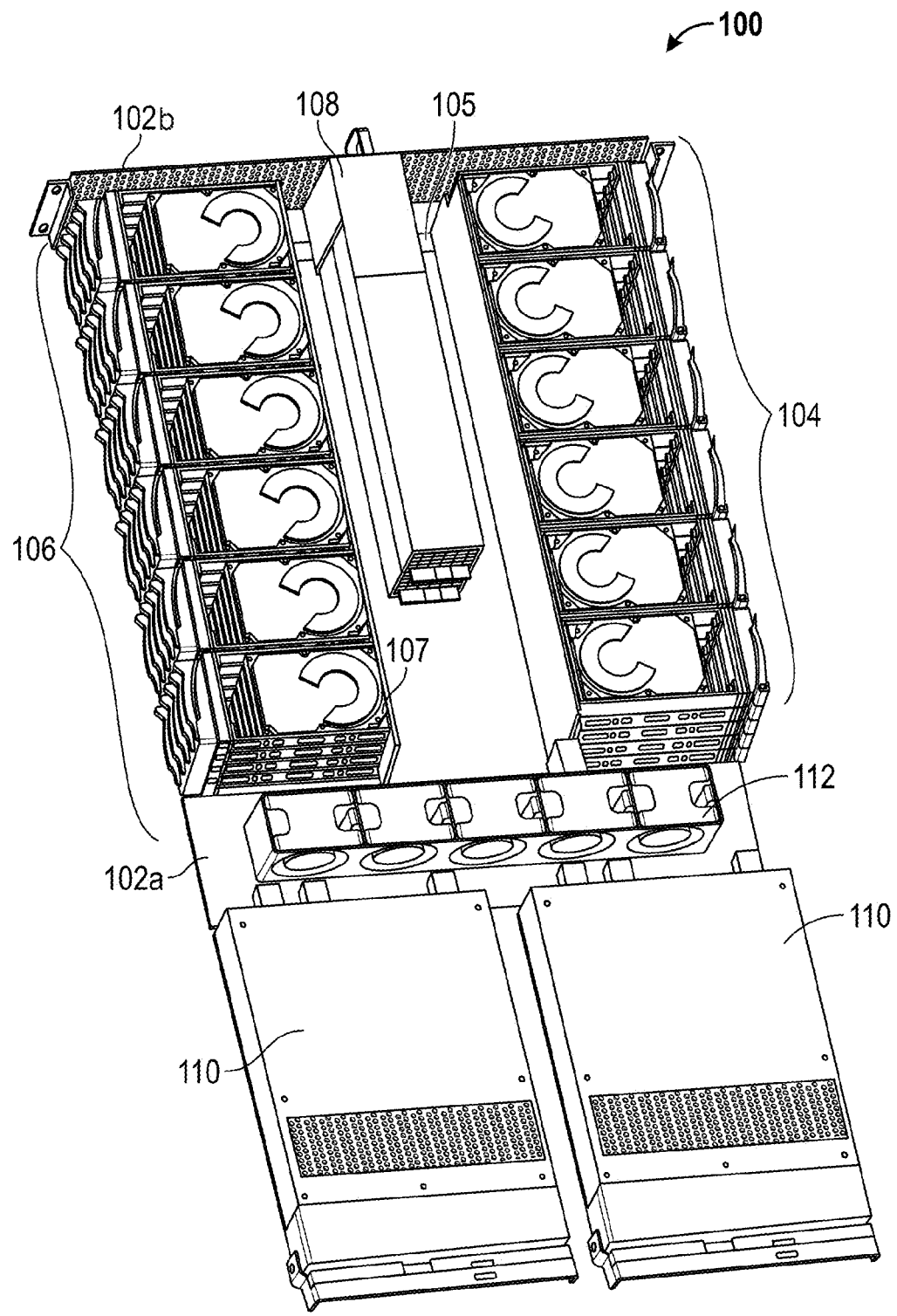
FIG. 1 illustrates an internal view of a side loading enclosure for a rack mount type storage unit, according to one embodiment.
Figure 2:
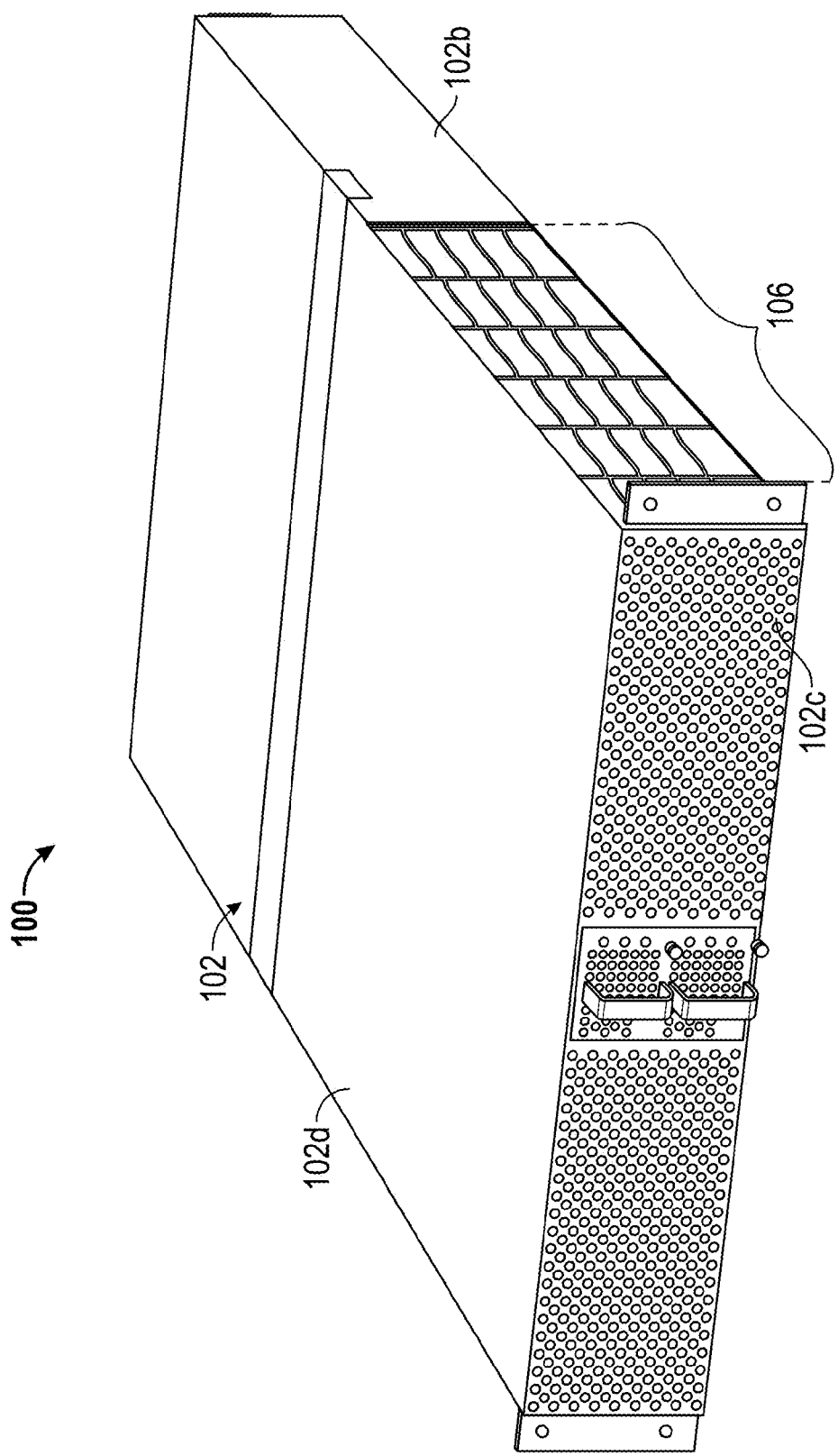
FIG. 2 illustrates a front perspective view of an enclosure for a rack mount type storage unit, according to one embodiment.
Figure 3:
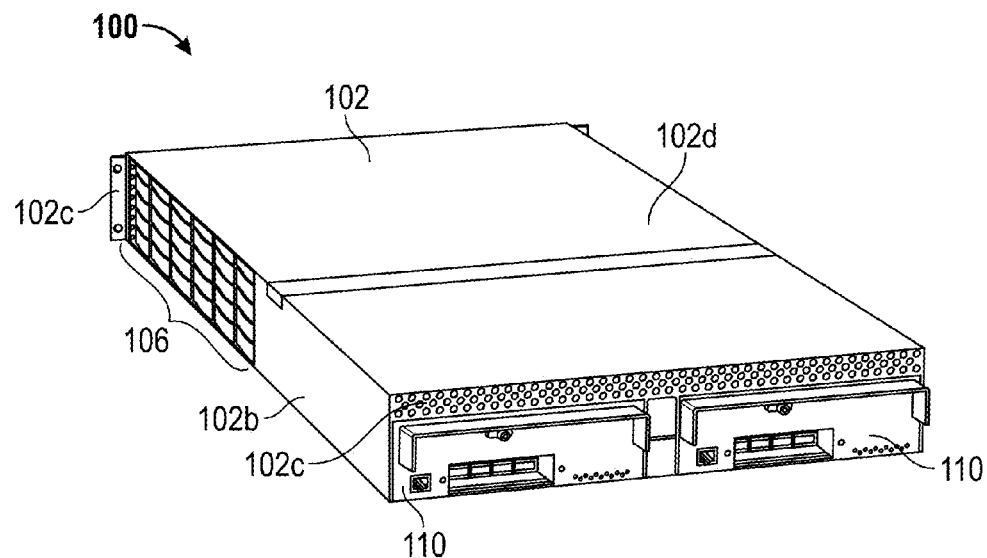
FIG. 3 illustrates a back perspective view of an enclosure for a rack mount type storage unit, according to one embodiment.

FIG. 1 illustrates an internal view of a side loading enclosure 100 for a rack mount type storage unit, according to one embodiment. FIG. 2 illustrates a front perspective view of an enclosure for a rack mount type storage unit, according to one embodiment. FIG. 3 illustrates a back perspective view of an enclosure for a rack mount type storage unit, according to one embodiment. The following discussion refers interchangeably to FIGS. 1-3.

The side loading enclosure 100 may include a housing 102 (See FIG. 2) having a bottom plate 102a integrally connected to a pair of side plates 102b and a pair of end plates 102c. A top plate 102d may be integrally connected to the pair of side plates 102b and the pair of end plates 102c forming the enclosure 100. The enclosure 100 may include slide rails (See FIG. 8) for sliding or pulling the enclosure out of the rack mount type storage unit for loading/replacing/repairing hard disk drives (HDDs) and then sliding or pushing the enclosure back into the rack.

As shown in FIG. 1, the internal components of the enclosure may be secured to the bottom plate 102a and include one or more rows of hard disk drives that are mounted from the side of the enclosure. According to one embodiment, a first row 104, perpendicular to and extending between the pair of end plates 102c, having six (6) stacks of 2.5 inch drives, may be separated from (and parallel to) a second row 106, perpendicular to and extending between the pair of end plates 102c, having six (6) stacks of 2.5 inch drives, by one or more power supplies 108 or other modules. Each of the stacks may include, for example five (5) 2.5 inch drives side loaded (or mounted on their sides), thus providing an enclosure that stores sixty (60) drives. When the drives are side loaded into the enclosure, each of the drives may be connected to, or received within, connecting members. The connecting members may be edge connectors located on respective cables or the connecting members may be sockets located on a first surface, or a second opposing surface, of printed circuit boards 105, 107. The printed circuit boards 105, 107 may be secured perpendicularly to the bottom plate, such that the drives are co-planar with the bottom plate. As such, the novel enclosure disclosed herein allows for the number of drives mounted in an enclosure to increase while still allowing easy access for individual drive replacements. According to one example, the number of drives mounted in an enclosure may be doubled. Although six (6) stacks of drives, each drive having five (5) drives is shown, this is by way of example only. There may be more than, or fewer than, six (6) stacks of drives having five (5) drives each.

Furthermore, one or more input/output (I/O) devices 110 may be mounted on the bottom plate, accessible through an end plate 102c, providing for high speed connections, for example. A plurality of cooling fans 112 may be located between the I/O devices 110 and the drives.

Figure 4:
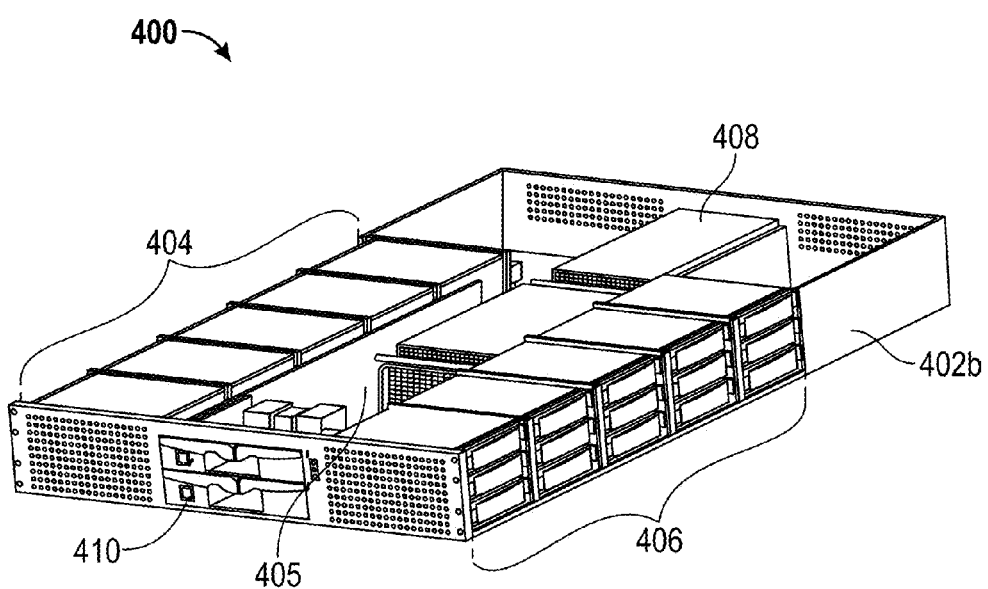
FIG. 4 illustrates a perspective view of a side loading enclosure for a rack mount type storage unit with the top plate removed, according to one embodiment.
Figure 5:
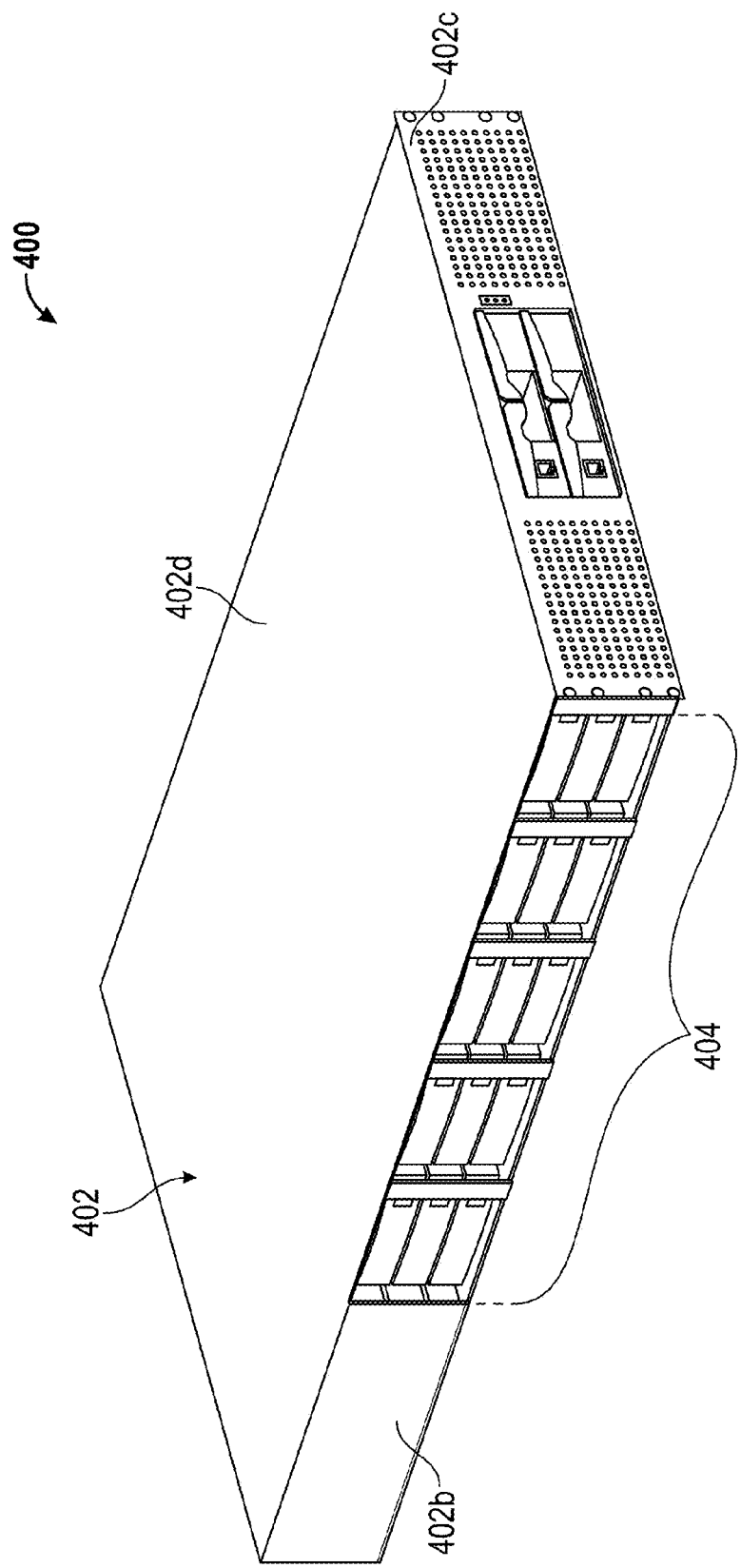
FIG. 5 illustrates the enclosure of FIG. 4 with the top plate covering the internal structure.

FIG. 4 illustrates a perspective view of a side loading enclosure 400 for a rack mount type storage unit with the top plate removed, according to one embodiment. The removal of the top plate of the enclosure 400 allows the internal structure of the enclosure 400 to be viewed. FIG. 5 illustrates the enclosure of FIG. 4 with the top plate covering the internal structure. The following discussion refers interchangeably to FIGS. 4-5.

The side loading enclosure 400 may include a housing 402 (See FIG. 5) having a bottom plate (not shown) integrally connected to a pair of side plates 402b and a pair of end plates 402c. A top plate 402d may be integrally connected to the pair of side plates 402b and the pair of end plates 402c forming the enclosure 400. The enclosure 400 may include slide rails (See FIG. 8) for sliding or pulling the enclosure out of the rack mount type storage unit for loading/replacing/repairing hard disk drives (HDDs) and then sliding or pushing the enclosure back into the rack.

As shown in FIG. 4, the internal components of the enclosure 400 may be secured to the bottom plate and include one or more rows of hard disk drives that are mounted from the side of the enclosure. According to one embodiment, a first row 404, perpendicular to and extending between the pair of end plates 402c, having five (5) stacks of 3.5 inch drives, may be separated from (and parallel to) a second row 406, perpendicular to and extending between the pair of end plates 402c, having five (5) stacks of 3.5 inch drives, by one or more power supplies 408. Each of the stacks may include, for example three (3) 3.5 inch drives side loaded (or mounted on their sides), thus providing an enclosure that stores thirty (30) drives. When side loaded into the enclosure 400, each of the drives may be connected to, or received within, a connector (not shown) on printed circuit boards 405, 407, secured perpendicularly to the bottom plate, such that the drives are co-planar with the bottom plate. As such, the novel enclosure disclosed herein allows for the number of drives in an enclosure to be increased while still allowing easy access for individual drive replacements. Although five (5) stacks of drives, each stack having three (3) drives is shown, this is by way of example only. There may be more than, or fewer than, five (5) stacks of drives having three (3) drives each.

Furthermore, one or more input/output (I/O) devices 410 may be mounted on the bottom plate, accessible through an end plate 402c providing for high speed connections, for example.

Figure 6:
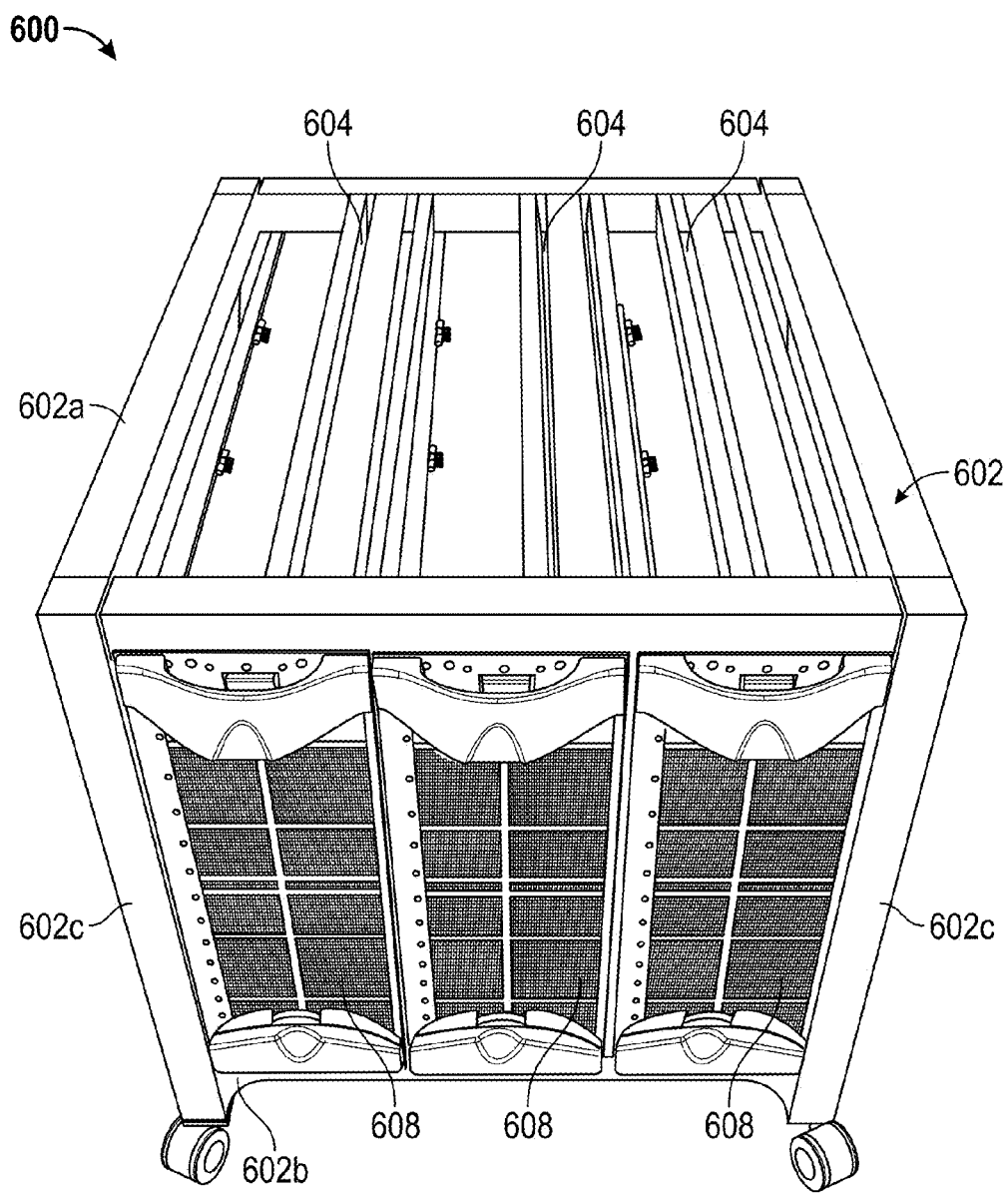
FIG. 6 illustrates a rack mount type storage unit for vertically mounting or receiving three (3) 4U-60 drives in 10U of rack space.

FIG. 6 illustrates a rack mount type storage unit for vertically mounting or receiving three (3) enclosures, such as 4U-60 drives, in 10U of rack space providing for greater density compared to conventional systems. According to one example, the rack mount type storage unit may provide for 20% greater density. As shown, the storage unit 600 may include a generally rectilinear frame 602 having an upper portion 602a and a lower portion 602b integrally connected by a pair of front side portions 602c and a pair of back side portions (not shown). The pair of front side portions 602c and the pair of back side portions extend vertically between the upper portion 602a and the lower portion 602b.

A plurality of upper elongated rail members 604 may be attached to an inner surface of the upper portion 602a, extending from a front of the upper portion 602a to a back of the upper portion 602a. A plurality of lower elongated rail members (not shown) may be attached to an inner surface of the lower portion 602b where the plurality of lower elongated rail members 606 (not shown), extending from a front of the lower portion 602b to a back of the lower portion 602b, may be co-planar with the plurality of upper elongated rail members 604. A plurality of enclosures 608 may be slideably engaged with the plurality of upper elongated rail members 604 and the plurality of lower elongated rail members 606, the one or more enclosures 608 vertically mounted in the rack storage unit 600.

Figure 7:
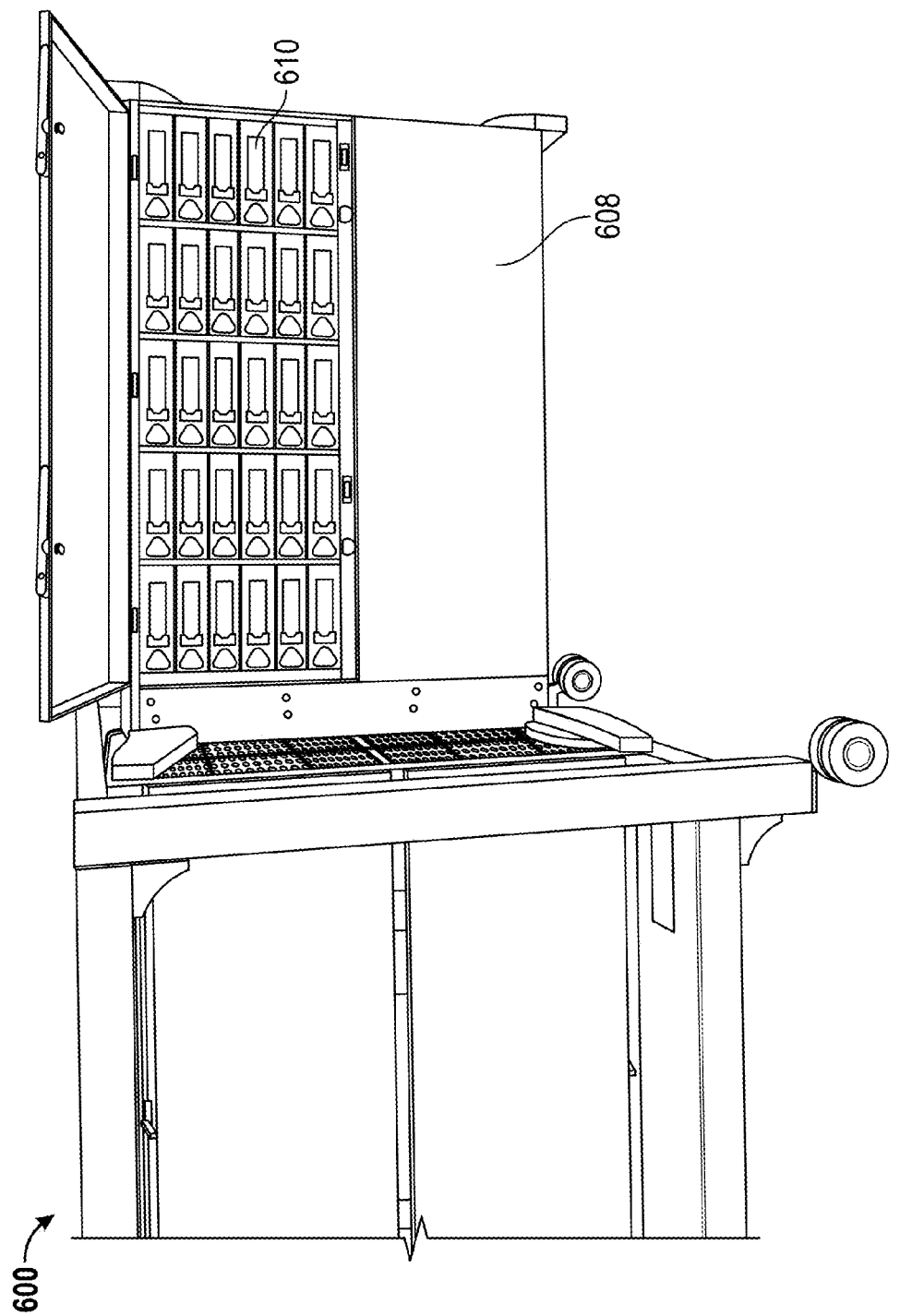
FIG. 7 illustrates the rack mount type storage unit of FIG. 6 with one (1) 4U-60 drive extending horizontally outward.

As shown in FIG. 7, the enclosures 608 may be pulled horizontally outward from the storage unit 600. One or more hard disk drives 610 may be mounted to each of the plurality of enclosures 608 such that the hard disk drives 610 are co-planar with the lower portion 602b of the frame allowing easy access to the one or more hard disk drives 610 when each of the plurality of enclosures 608 is slideably pulled from the storage unit in a horizontal direction.

While the present disclosure describes the enclosures and rack mount type storage units as containing only side load drives, the enclosures and rack mount type storage units may also contain front loading drives in addition to the side loading drives.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. An enclosure for a rack mount storage unit, comprising:
a bottom plate defining a first horizontal plane;
a pair of side plates having a first side plate and a second side plate, the side plates are parallel and define a vertical plane;
a pair of end plates having a first end plate and a second end plate, the bottom plate, the pair of side plates and the pair of end plates being integrally connected;
a first row, extending perpendicularly between the pair of end plates, having one or more stacks of hard disk drives connected to a first circuit board extending perpendicularly upward from the bottom plate and parallel to the first side plate, each of the one or more stacks of hard drives has an upper surface and an opposing lower surface, and each stack having the lower surfaces of two or more hard disk drives stacked vertically and where each hard disk drive of the two or more hard disk drives in the one or more stacks of hard disk drives in the first row co-planar with the bottom plate defining the first horizontal plane; and
a second row, extending between the pair of end plates, having one or more stacks of hard disk drives connected to a second circuit board extending perpendicularly upward from the bottom plate and parallel to the first side plate, each of the one or more stacks of hard drives has an upper surface and an opposing lower surface, and each stack having two or more hard disk drives stacked vertically and where each hard disk drive of the two or more hard disk drives in the one or more stacks of hard disk drives in the second row co-planar with the bottom plate defining the first horizontal plane;

wherein the first and second circuit boards extend perpendicularly upward from the bottom plate.

2. The enclosure of claim 1, wherein the one or more stacks of hard disk drives in the first row is separate from and located parallel to the one or more stacks of hard disk drives in the second row.

3. The enclosure of claim 2, further comprising a power supply mounted to the bottom plate between the one or more stacks of hard disk drives in the first row and the one or more stacks of hard disk drives in the second row.

4. The enclosure of claim 2, wherein each of the one or more stacks of hard disk drives includes five (5) 2.5 hard disk drives.

5. The enclosure of claim 2, wherein each of the one or more stacks of hard disk drives includes three (3) 3.5 hard disk drives.

6. The enclosure of claim 1, further comprising one or more input/output devices mounted on the bottom plate and accessible through an end plate in the pair of end plates.

7. The enclosure of claim 1, further comprising a plurality of cooling fans mounted on the bottom plate.

8. The enclosure of claim 1, further comprising a top plate integrally connected to the pair of end plates and the pair of side plates.

9. The enclosure for a rack mount storage unit of claim 1, wherein the first and second rows of hard disk drives have a first end and a second end where the first end is connected to the first end plate; and wherein the first side panel extends from the second end of the first row of hard disk drives to the second end plate; and wherein the second side panel extends from the second row of hard disk drives to the second end plate.

10. The enclosure of claim 1, wherein the each of the two or more hard disk drives stacked vertically in each of the one or more stacks in the first row are located within a same first vertical plane of a first side panel that extends and end of the one or more stack in the first row to the second end plate;

wherein the each of the two or more hard disk drives stacked vertically in each of the one or more stacks in the second row are located within a same second vertical plane of a second side panel that extends and end of the one or more stack in the first row to the second end plate.

11. A vertical mount rack storage unit for holding enclosures, comprising:

a rectilinear frame having an upper portion and a lower portion integrally connected by a pair of front side portions and a pair of back end portions, the upper portion are parallel and define a horizontal plane;

a plurality of upper elongated rail members attached to an inner surface of the upper portion, the plurality of upper elongated rail members extending from a front end of the upper portion to a back end of the upper portion;

a plurality of lower elongated rail members attached to an inner surface of the lower portion, the plurality of lower elongated rail members, extending from a front end of the lower portion to a back end of the lower portion, co-planar with the plurality of upper elongated rail members; and a plurality of enclosures slideably engaged with the plurality of upper elongated rail members and the plurality of lower elongated rail members, each enclosure in the plurality of enclosures vertically mounted in the rack storage unit;

wherein one or more rows of hard disk drives, each having an upper surface and an opposing lower surface, are mounted in stacks within each of the plurality of enclosures such that the hard disk drives are co-planar with the lower portion of the frame allowing easy access to the disk drives when one of the plurality of enclosures is slideably pulled from the storage unit in a horizontal direction; and wherein the one or more hard disk drives are connected to one or more printed circuit boards which are located perpendicularly to a bottom panel of the enclosure and parallel to a pair of side plates of the enclosure which are parallel to the plurality of upper and lower elongated rail members.

12. The vertical mount rack storage unit of claim 11, wherein each enclosure in the plurality of enclosures comprises:

the bottom plate;

the pair of side plates having a first side plate and a second side plate;

a pair of end plates, the bottom plate, the pair of side plates and the pair of end plates being integrally connected;

a first row, extending perpendicularly between the pair of end plates, having one or more stacks of hard disk drives connected to a first printed circuit board extending perpendicularly upward from the bottom plate and parallel to the first side plate, each hard disk drive in the one or more stacks of hard disk drives in the first row co-planar with the bottom plate; and a second row, extending perpendicularly between the pair of end plates, having one or more stacks of hard disk drives connected to a second printed circuit board extending perpendicularly upward from the bottom plate and parallel to the second side plate, each hard disk drive in the one or more stacks of hard disk drives in the second row co-planar with the bottom plate;

wherein the first and second circuit boards extend perpendicularly upward from the bottom plate.

13. The vertical mount rack storage unit of claim 12, wherein the one or more stacks of hard disk drives in the first row is separate from and located parallel to the one or more stacks of hard disk drives in the second row.

14. The vertical mount rack storage unit of claim 13, further comprising a power supply mounted to the bottom plate between the one or more stacks of hard disk drives in the first row and the one or more stacks of hard disk drives in the second row.

15. The vertical mount rack storage unit of claim 13, wherein each of the one or more stacks of hard disk drives includes five (5) 2.5 hard disk drives.

16. The vertical mount rack storage unit of claim 13, wherein each of the one or more stacks of hard disk drives includes three (3) 3.5 hard disk drives.

17. The vertical mount rack storage unit of claim 12, further comprising one or more input/output devices mounted on the bottom plate and accessible through an end plate in the pair of end plates.

18. The vertical mount rack storage unit of claim 12, further comprising a top plate integrally connected to the pair of end plates and the pair of side plates.

19. The vertical mount rack storage unit of claim 12, each enclosure in the plurality of enclosures is a 4U-60 drive.

20. A vertical mount rack storage unit for holding enclosures, comprising:
- a rectilinear frame having an upper portion and a lower portion integrally connected by a pair of front side portions and a pair of back end portions, the upper portion are parallel and define a horizontal plane;
- a plurality of upper elongated rail members attached to an inner surface of the upper portion, the plurality of upper elongated rail members extending from a front end of the upper portion to a back end of the upper portion;
- a plurality of lower elongated rail members attached to an inner surface of the lower portion, the plurality of lower elongated rail members, extending from a front end of the lower portion to a back end of the lower portion, co-planar with the plurality of upper elongated rail members; and
- a plurality of enclosures slideably engaged with the plurality of upper elongated rail members and the plurality of lower elongated rail members, each enclosure in the plurality of enclosures is vertically mounted in the rack storage unit and comprises:
  - a bottom plate located in the horizontal plane;
  - a pair of side plates having a first side plate and a second side plate;
  - a pair of end plates having a first end plate and a second end plate, the bottom plate, the pair of side plates and the pair of end plates being integrally connected;
  - a first row, extending perpendicularly between the pair of end plates, having one or more stacks of hard disk drives connected to a first printed circuit board extending perpendicularly upward from the bottom plate and parallel to the first side plate, each of the one or more stacks of hard drives has an upper surface and an opposing lower surface, and each stack having the lower surfaces of two or more hard disk drives stacked vertically and where each hard disk drive of the two or more hard disk drives in the one or more stacks of hard disk drives in the first row co-planar with the bottom plate; and
  - a second row, extending perpendicularly between the pair of end plates, having one or more stacks of hard disk drives connected to a second printed circuit board extending perpendicularly upward from the bottom plate and parallel to the second side plate, each of the one or more stacks of hard drives has an upper surface and an opposing lower surface, and each stack having two or more hard disk drives stacked vertically and where each hard disk drive of the two or more hard disk drives in the one or more stacks of hard disk drives in the second row co-planar with the bottom plate;
  - wherein the first and second circuit boards extend perpendicularly upward from the bottom plate.

* * * * *